United States Patent [19]
Konuma

[11] Patent Number: 5,598,017
[45] Date of Patent: Jan. 28, 1997

[54] IMAGE SENSOR HAVING CHARGE COUPLED DEVICE REGISTERS AND DRIVING METHOD THEREOF

[75] Inventor: Kazuo Konuma, Tokyo, Japan

[73] Assignee: NEC Corporation, Tokyo, Japan

[21] Appl. No.: 325,152

[22] Filed: Oct. 20, 1994

[30] Foreign Application Priority Data

Nov. 11, 1993 [JP] Japan .................................. 5-282236

[51] Int. Cl.$^6$ .................................................. H01L 27/148
[52] U.S. Cl. .................... 257/232; 257/242; 257/246; 257/249; 257/250; 257/443; 257/448
[58] Field of Search .................................. 257/222, 224, 257/225, 231, 232, 229, 242, 246, 249, 250, 233, 443, 448; 358/213.29, 213.23, 213.22, 44

[56] References Cited

U.S. PATENT DOCUMENTS 4,500,915   2/1985   Koike et al. ........................ 358/44

FOREIGN PATENT DOCUMENTS

63-18664   1/1988   Japan .................................. 257/225

*Primary Examiner*—Minhloan Tran
*Attorney, Agent, or Firm*—Whitham, Curtis, Whitham & McGinn

[57] ABSTRACT

A number of electrode sets each respectively consisting of a number of gate electrodes disposed at each of matrix-addressed charge-coupled device ("CCD") registers are separately arranged in a column direction of the registers, the gate electrodes in each of the electrode sets being separately arranged in a different direction from the column direction, and a combination of interconnections is provided among conductors for selectively applying a number of pulse voltages different in phase to the gate electrodes in each of the electrode sets. The pulse voltages are applied with a combination of different phases to the gate electrodes in each of the electrode sets, and the combination of the different phases are changed, thereby controlling the position of a sensitivity barycenter of each of the electrode sets to raise the resolution of an image sensor.

20 Claims, 5 Drawing Sheets

IMAGE SENSOR HAVING CHARGE COUPLED DEVICE REGISTERS AND DRIVING METHOD THEREOF

BACKGROUND OF THE INVENTION

The present invention relates to an image sensor and a driving method thereof.

Description of the Related Art

Figure 1:
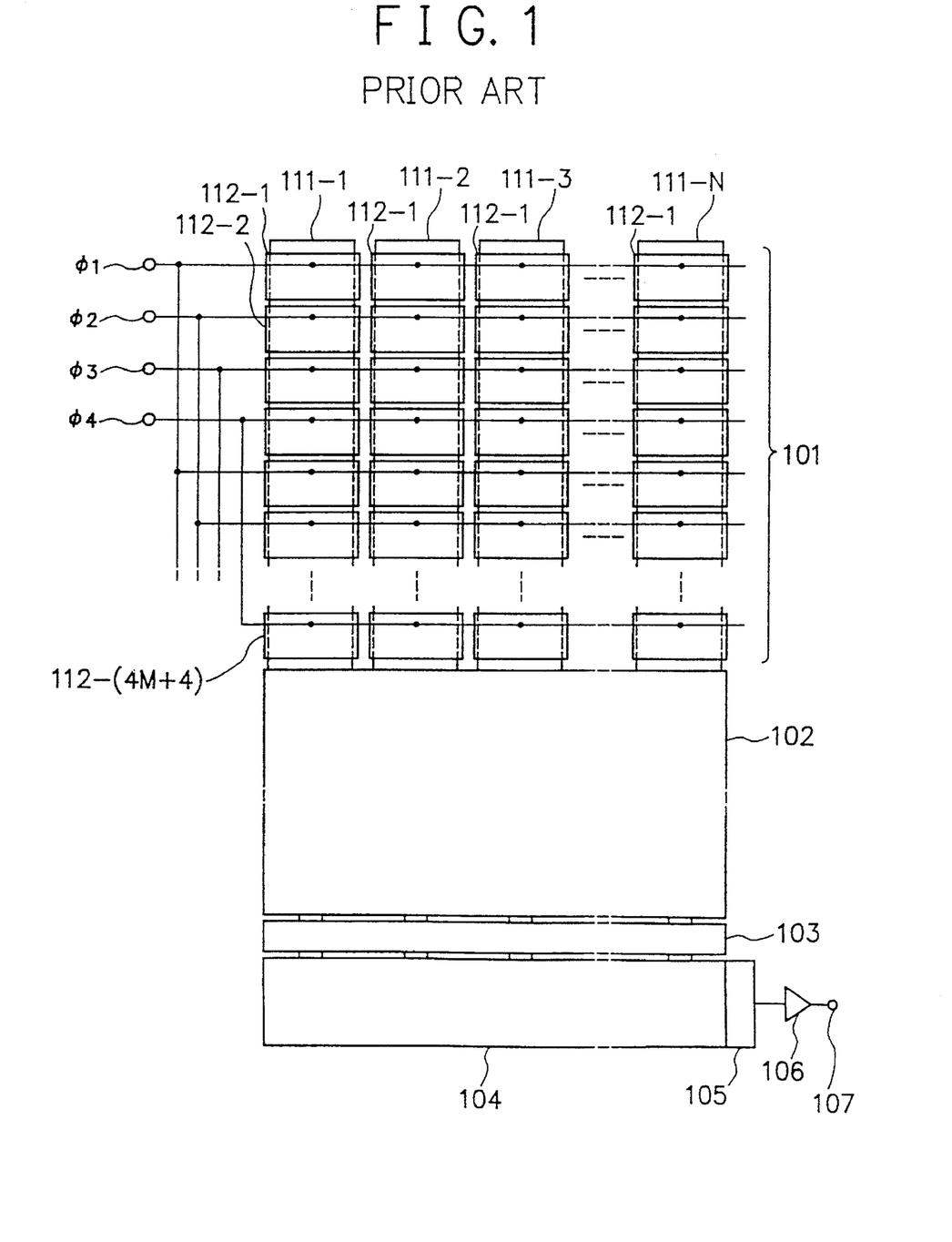
FIG. 1 is a combination of a schematic front view and a block diagram of a conventional image sensor.
Figure 2:
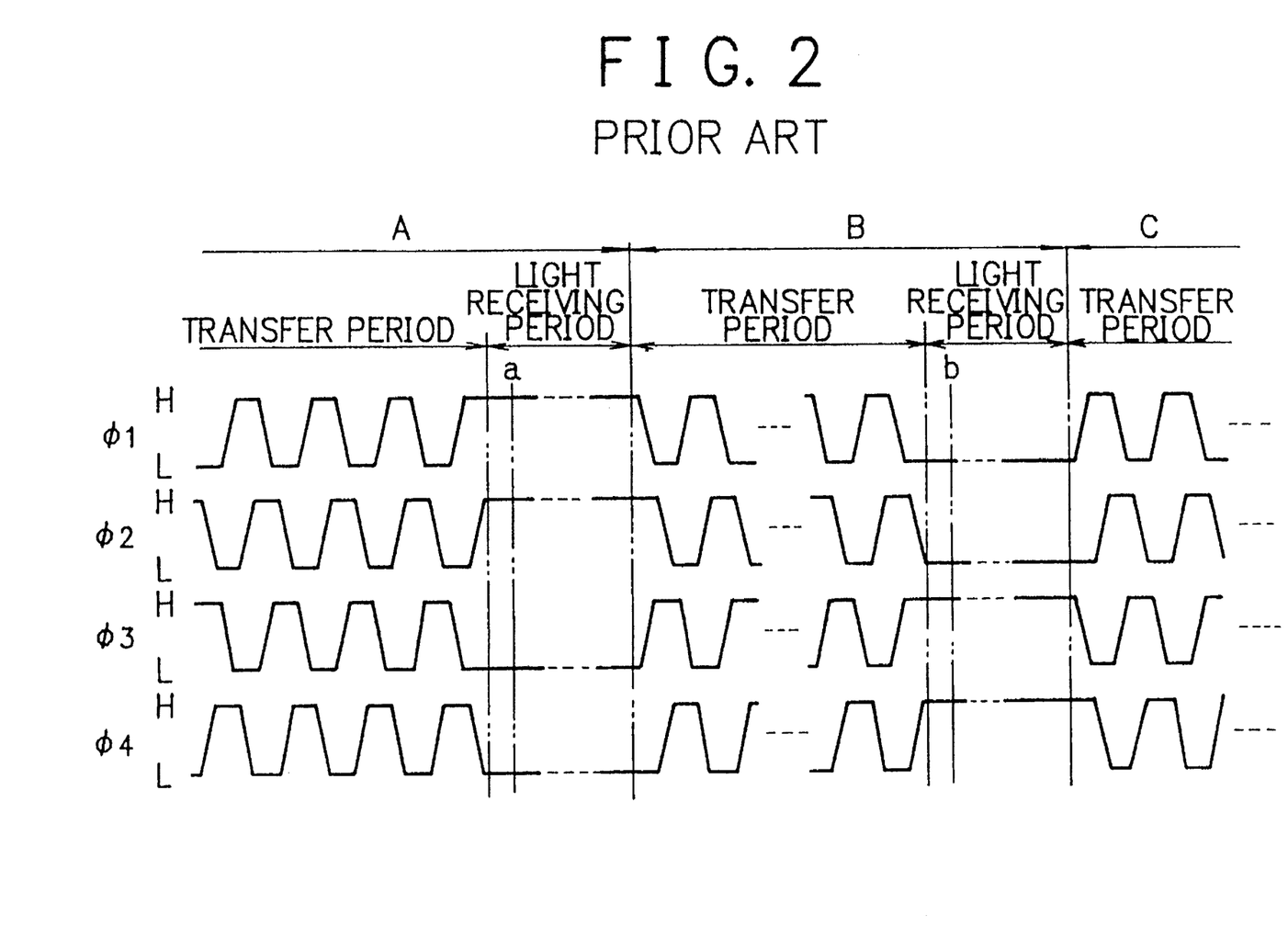
FIG. 2 is a timing chart showing some field periods of a frame for describing a driving method of the image sensor of FIG. 1.

There has conventionally been proposed an image sensor having a configuration and connections schematically illustrated in FIG. 1 and a frame of charge transfer operation partially shown in the form of a timing chart in FIG. 2 for describing a driving method. The conventional image sensor has in a light receiving area 101 thereof a plurality of vertically extending CCD (charge-coupled device) registers arranged in the form of an N×4 matirix (where N is a larger integer than one), the vertical CCD registers being each (for example, a left-most top one consisting of a CCD channel 111-1 and a plurality of gate electrodes 112-1, 112-2, ..., 112-(M+1), where M is a larger integer than one) respectively functioning to convert incident light into electric charges and accumulate those charges for a preset period of time. In the image sensor, a memory area 102 is arranged at the lower end of the light receiving area 101, including a plurarity of vertically extending CCD registers for storing tranferred charges as signals from the vertical CCD registers of the light receiving area 101. The vertical CCD registers of the memory area 102 are connected through a transfer gate 103 to a horizontally extending CCD register 104 which has at one end thereof an output section 105 for sequentially outputting transferred signals, the output section 105 being connected through a built-on-chip amplifier 106 to an output terminal 107. Image sensors having such a configuration are generally called "a frame transfer type CCD image sensor".

The conventional image sensor is constituted as a front incidence type such that incident light to the front surface is transmitted to be photo-electrically converted in respective CCD channels 111-1 to 111-N of the vertical CCD registers in the light receiving area 101. For each vertical CCD register, the incident light is transmitted by M gate electrodes made of a polycrystalline silicone and an $SiO_2$ insulation film formed on a semiconductor substrate, and is photo-electrically converted at each p-n junction between the semiconductor substrate and a CCD channel region that is reversely biased with an applied voltage to a corresponding one of the gate electrodes. A rear incidence type image sensor may have a thin substrate for transmitting incident light from the rear surface to a similar channel region for effecting photo-electric conversion and charge accumulation.

In the conventional frame transfer type CCD image sensor, the gate electrodes N×(4M+4) in number are grouped into M sets. Each set has four gate electrodes 112-(4n+1) to 112-(4n+4), letting n=0, 1, 2, ..., M, each respectively supplied with one of four pulse voltages $\phi_1$ to $\phi_4$. When supplied with a pulse voltage, the electrode has a channel potential developed thereunder that is relatively low or "deep" if the supplied voltage is at a high level "H", and is relatively high or "shallow" if it is at a low level "L". For example, as shown in FIG. 2, the frame transfer type CCD image sensor has at a time point "a" during a light receiving period in a field range A a channel potential develop as follows. With the voltage "H" applied to gate electrodes 112-(4n+1) and 112-(4n+2) and the voltage "L" applied to gate electrodes 112-(4n+3) and 112-(4n+4), a deep potential region develops below each of the gate electrodes 112-(4n+1) and 112-(4n+2), and a shallow potential region, below each of the gate electrodes 112-(4n+3) and 112-(4n+4), functioning as a bucket for keeping charges therein.

In the frame transfer type CCD image sensor, incident light to CCD channels during each light receiving period in FIG. 2 is photo-electrically converted, and electric charges 10 generated according to the intensity of incident light are accumulated. The photo-electric conversion and the charge accumulation will be hereinbelow collectively referred to as "photo-sensing".

In the light receiving period in the field range A, the photo-sensing is effected in channels below the gate electrodes 112-(4n+1) and 112-(4n+2), but not below the gate electrodes 112-(4n+3) and 112-(4n+4). In contrast therewith, at a time point "b" during the light receiving period in a successive field range B, the photo-sensing develops below the gate electrodes 112-(4n+3) and 112-(4n+4). In a transfer period in each field range, the accumulated charges in the light receiving area 101 are transferred to the memory area 102, where they are stored as signals to be sent therefrom via the transfer gate 103 to the horizontal CCD register 104, to be sequentially outputted.

Figure 3A:
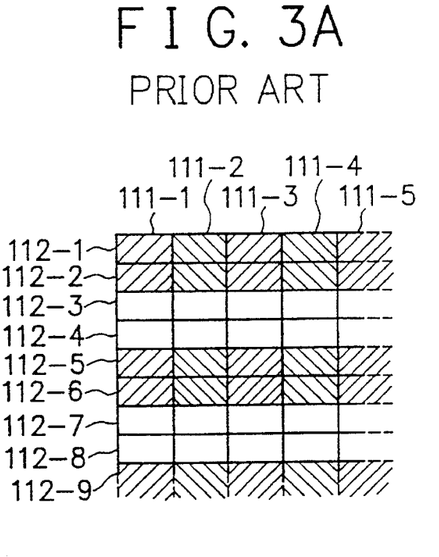
FIGS. 3A to 3D are schematic front views illustrating restricted variations of photo-sensing actions in an essential part of a light receiving area of the image sensor of FIG. 1.
Figure 3B:
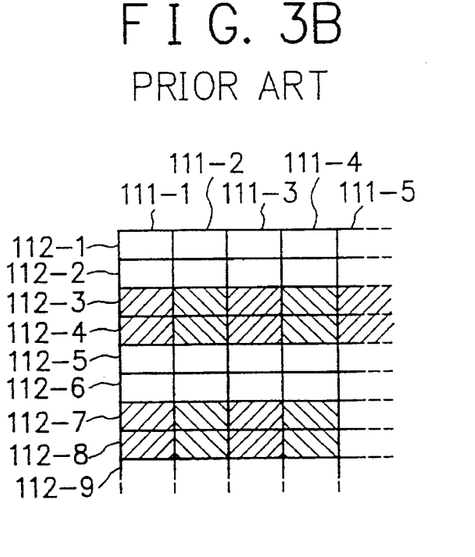
Figure 3C:
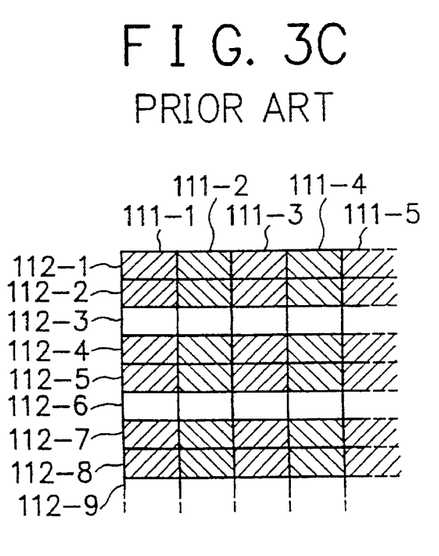
Figure 3D:
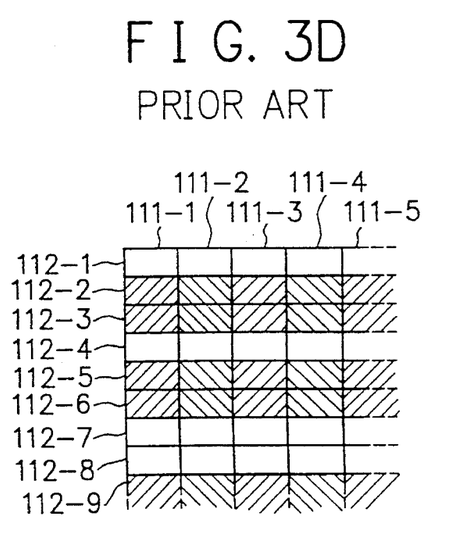

Through such actions, a light intensity distribution over the light receiving area 101 is spatially sampled, and is obtained as a series of time sequential signals from the output terminal 107. FIGS. 3A to 3D schematically illustrate photo-sensing actions in such spatial sampling. FIGS. 3A and 3B show associated actions with the time points "a" and "b", respectively, in the described operation mode. FIGS. 3C and 3D show corresponding actions in a modified operation mode. In the case of FIG. 3C, the photo-sensing is effected in CCD channels below gate electrodes 112-1, 112-2; 11-4, 112-5; 112-7, 112-8; and so on. In FIG. 3D, it develops in CCD channels below gate electrodes 112-(4n+2) and 112-(4N+3).

In the frame transfer type CCD image sensor, the combination of high and low applied voltages to gate electrodes is flexibly controlled to increase and decrease the number of spatial sampling locations of light intensity and the size thereof in the vertical direction, as well as for varying the barycenter of sampling in that direction. However, in the horizontal direction, the controllable number of sampling locations directly depends on a limited number of columns of built-in vertical CCD registers. It therefore is necessary for a higher spatial resolution in the horizontal direction to use an increased number of vertical CCD registers, causing the number of horizontal CCD register stages to be increased.

As the signal charge transfer loss is alike at any horizontal CCD register stage, the increased stage number results in an increased total transfer loss through the whole stages. Further, as the number of vertical CCD registers is increased in a predetermined light receiving area, each of them has to share a reduced mount area. However, the isolation distance between vertical CCD registers depends their own structure, as well as fabrication process and driving conditions. The area of isolation region thus has a limit under which it cannot be reduced in accordance with a miniturized vertical CCD register. The effective channel area as a photo-sensitive region of such a miniturized register has to become the more reduced with a lowered sensitivity. On the other hand, if an image sensor of the described type has an increased number of verticqal CCD registers without changing a shared mount area thereof, the light receiving area is needed to have a wider width, which leads to other problems due, for example, to severe criteria required for the optical system.

As described above, if the vertical CCD registers are increased in number to obtain a higher spatial resolution, there arise various problems such as degraded performance including a lowered sensitivity and an increased transfer loss or due to severe criteria for optical system.

Moreover, in practical applications, the image sensor needs to exhibit an adapted combination of optimal performances, exemplarily of spatial resolution, sensitivity and frame rate, in accordance with intended usage and the nature of target. For example, an image sensor built in a camera needs a high spatial resolution when shooting a moderately moving target to obtain a well defined figure. In that case, however, the frame rate requirement is not tight. Conversely, to attain information on movements of a rapid target, a high frame rate is required, although the spatial resolution may not be high. Since the state of target and concurrently required output vary with time, associated optimal values of such performances are needed to vary accordingly.

As the required period for a cyclic operation of vertical CCD registers becomes shorter, the shared mount area to each of them decreases, and each light receiving element has a reduced size with a lower sensitivity. If the number of vertical CCD registers increases with a maintained data read rate, the frame rate becomes low. Like this, there exist inseparable relationships between the shared mount area to each vertical CCD register and the sensitivity thereof and between the number of vertical CCD registers and the frame rate, with dependencies either having to the other to mutually limit associated performances, respectively In conventional image sensors, an areal distribution of the intensity of incident light to a light receiving area is spatially sampled by a matrix of photo-sensing cells functioning as a determinant of the period of a sampling cycle. In the frame transfer type image sensor, the period of a minimized spatial sampling cycle in the horizontal direction equals that of an operation cycle of vertical CCD registers. In other words, the vertical CCD register operation cycle constitutes a fundamental unit of sampling operations in the horizontal direction. It therefore is impossible to use a shorter cycle than that cycle to obtain a higher spatial resolution, which means the vertical CCD register operation cycle should be shorter than or at most equal to a required cyce for a desired spatial resolution.

In the conventional image sensor described, the vertical CCD register operation cycle determines the maximum of available spatial resolution, inspire of a flexible adatability required of performances such as of sensitivity, frame rate and the spatial resolution under varying conditions with time. It therefore is necessary to determine the period of a vertical CCD register operation cycle in accordance with the case of a required maximum spatial resolution. This leads to the difficulty of having an adapted combination of optimal performances under circumstances that need a reduced spatial resolution with an increased sensitivity or frame rate. As a result, it is needed to choose an exclusive image sensor and driving method, as circumstances require. For example, it is necessary to select a high resolution camera, a high sensitivity camera for a low illuminance use or a high frame rate camera for a high speed shooting use, whichever meets the situation.

SUMMARY OF THE INVENTION

It is therefore an object of the present invention to provide an image sensor and a driving method thereof with a flexibly adaptive performance.

To achieve the object, a genus of a subject matter of the present invention provides an image sensor including a plurality of CCD registers arranged in the form of a matrix and oriented in a column direction of the matrix, the CCD registers each respectively having a photo-sensitive CCD channel formed therein, the CCD channel having a plurality of gate electrodes disposed thereon, and a plurality of conductors each respectively connected to an arbitrary one of the gate electrodes at each of the CCD registers, comprising: a number of electrode sets each respectively consisting of a number of the gate electrodes disposed at each of the CCD registers; the electrode sets being separately arranged in a column direction of the matrix of the CCD registers; the gate electrodes in each of the electrode sets being separately arranged in a different direction from the column direction; and a combination of interconnections among the conductors for selectively applying a number of pulse voltages different in phase to the gate electrodes in each of the electrode sets.

According to a species of the genus of the present invention, the number of pulse voltages different in phase does not exceed the number of gate electrodes in each of the electrode sets.

According to another species of the genus of the present invention, the different direction as an arrangement direction of the gate electrodes in each of the electrode sets is a row direction of the matrix of the CCD registers.

According to still another species of the genus of the present invention, the electrode sets arranged in the column direction at each of the CCD registers are grouped through the combination of the interconnections among the conductors into four groups of every fourth ones thereof so that four of the pulse voltages are selectively supplied to the four gourps.

Further, to achieve the object, another genus of the subject matter of the present invention provides a method for driving an image sensor including a plurality of CCD registers arranged in the form of a matrix and oriented in a column direction of the matrix, the CCD registers each respectively having a photo-sensible CCD channel formed therein, the CCD channel having a plurality of gate electrodes disposed thereon, a plurality of conductors each respectively connected to an arbitrary one of the gate electrodes at each of the CCD registers, a number of electrode sets each respectively consisting of a number of the gate electrodes disposed at each of the CCD registers, the electrode sets being separately arranged in a column direction of the matrix of the CCD registers, the gate electrodes in each of the electrode sets being separately arranged in a different direction from the column direction, and a combination of interconnections among the conductors for selectively applying a number of pulse voltages different from each other in phase to the gate electrodes in each of the electrode sets, comprising the steps of: applying the pulse voltages with a combination of different phases to the gate electrodes in each of the electrode sets; and changing the combination of the different phases, thereby controlling the position of a sensitivity barycenter of each of the electrode sets to raise the resolution of the image sensor.

According to the subject matter of the present invention, therefore, a number of gate electrodes in each of electrode sets at each of matrix-addressed CCD registers oriented in a column direction thereof are separately arranged in a different direction from the column direction, and are applied with a number of pulse voltages different in phase by means of a combination of interconnections among a plurality of conductors each respectively connected to an arbitrary one of the gate electrodes.

The pulse voltages may thus be advantageously varied in level, phase and/or combination, permitting an essential performance of the image sensor to be flexibly adapted, as circumstances require.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

There will be described below preferred embodiments of the present invention. with reference to FIGS. 4, 5 and 6A to 6D.

Figure 4:
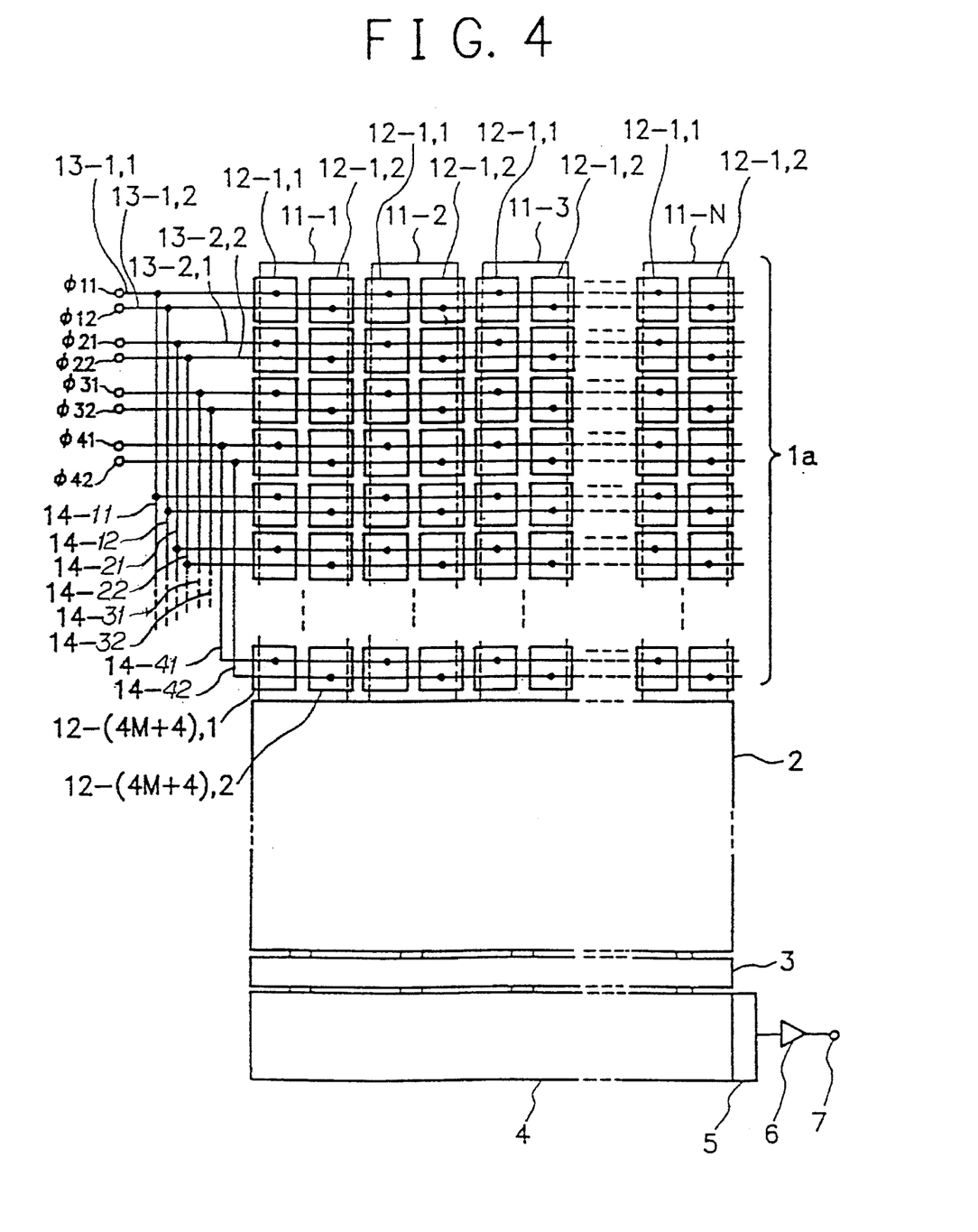
FIG. 4 is a combination of a schematic front view and a block diagram of an image sensor in accordance with a preferred embodiment of a genus of the present invention.

Referring first to FIG. 4, description will be given of the constitution of an image sensor according to a preferred embodiment of the invention.

The image sensor shown in FIG. 4 is proposed as a frame transfer type CCD image sensor consisting of a later-described light receiving area 1a as an upper (in the position in FIG. 4) panel structure for intermittently supplying a number of photo-sensing signals in the form of various quantities of electric charges, a memory area 2 as a vertically intermediate structure including a plurarity of unshown vertically extending CCD registers for storing tranferred signal charges from the light receiving area 1a and for shiftingly transferring the signal charges to output them through a transfer gate 3, and a horizontally extending CCD register 4 as a lower structure having at one longitudinal end thereof an output section 5 for sequentially outputting transferred signal charges from the memory area 2. The output section 5 is connected through a built-on-chip amplifier 6 to an output terminal 7.

The image sensor of FIG. 4 includes in the light receiving area 1a a plurality of CCD registers (representend by their internal structures in FIG. 4) arranged in the form of a 4 (rows)×N (columns) matrix (where N is a larger integer than one) and all oriented to extend in a column direction of the matrix (i.e. in the vertical direction in the position in FIG. 4). Each of the CCD registers has a photo-sensitive CCD channel 11-1, 11-2, 11-3, ..., or 11-N formed therein. The CCD channel has a plurality of gate electrodes:

| | |
|---|---|
| 12-1,1 | and 12-1,2 (paired in FIG. 4), |
| 12-2,1 | and 12-2,2 (paired, unnumbered in FIG. 4), |
| 12-3,1 | and 12-3,2 (paired, unnumbered in FIG. 4), |
| 12-4,1 | and 12-4,2 (paired, unnumbered in FIG. 4), |
| 12-5,1 | and 12-5,2 (paired, unnumbered in FIG. 4), |
| 12-6,1 | and 12-6,2 (paired, unnumbered in FIG. 4), |
| . | |
| . | |
| 12-M,1 | and 12-M,2 (paired, unshown in FIG. 4) and |
| 12-(M + 1),1 | and 12-(M + 1),2 (paired, unshown in FIG. 4); |
| 12-(M + 2),1 | and 12-(M + 2),2 (paired, unshown in FIG. 4), |
| . | |
| . | |
| 12-(2M + 1),1 | and 12-(2M + 1),2 (paired, unshown in FIG. 4) and |
| 12-(2M + 2),1 | and 12-(2M + 2),2 (paired, unshown in FIG. 4); |
| 12-(2M + 3),1 | and 12-(2M + 3),2 (paired, unshown in FIG. 4), |
| . | |
| . | |
| 12-(3M + 2),1 | and 12-(3M + 2),2 (paired, unshown in FIG. 4) and |
| 12-(3M + 3),1 | and 12-(3M + 3),2 (paired, unshown in FIG. 4); or |
| 12-(3M + 4),1 | and 12-(3M + 4),2 (paired, unshown in FIG. 4), |
| . | |
| . | |
| 12-(4M + 3),1 | and 12-(4M + 3),2 (paired, unshown in FIG. 4) and |
| 12-(4M + 4),1 | and 12-(4M + 4),2 (paired in FIG. 4) | disposed thereon (where M is a larger integer than one).

The image sensor of FIG. 4 further includes in the light receiving area 1a a plurality of conductors each respectively connected to an arbitrary one of the gate electrodes at each of the CCD registers, that is: conductors

| | | |
|---|---|---|
| 13-1,1 | connected to gate electrode | 12-1,1, |
| 13-1,2 | to | 12-1,2, |
| 13-2,1 | to | 12-2,1, |
| 13-2,2 | to | 12-2,2, |
| 13-3,1 (unnumbered in FIG. 4) | to | 12-3,1, |
| 13-3,2 (unnumbered in FIG. 4) | to | 12-3,2, |
| 13-4,1 (unnumbered in FIG. 4) | to | 12-4,1, |
| 13-4,2 (unnumbered in FIG. 4) | to | 12-4,2, |
| 13-5,1 (unnumbered in FIG. 4) | to | 12-5,1, |
| 13-5,2 (unnumbered in FIG. 4) | to | 12-5,2, |
| 13-6,1 (unnumbered in FIG. 4) | to | 12-6,1, |
| 13-6,2 (unnumbered in FIG. 4) | to | 12-6,2, |
| . | | |
| . | | |
| 13-M,1 (unshown in FIG. 4) | to | 12-M,1, |
| 13-M,2 (unshown in FIG. 4) | to | 12-M,2, |
| 13-(M + 1),1 (unshown in FIG. 4) | to | 12-(M + 1),1 and |
| 13-(M + 1),2 (unshown in FIG. 4) | to | 12-(M + 1),2; |
| 13-(M + 2),1 (unshown in FIG. 4) | to | 12-(M + 1),1, |
| 13-(M + 2),2 (unshown in FIG. 4) | to | 12-(M + 1),2, |
| . | | |
| . | | |
| 13-(2M + 1),1 (unshown in FIG. 4) | to | 12-(2M + 1),1, |
| 13-(2M + 1),2 (unshown in FIG. 4) | to | 12-(2M + 1),2, |
| 13-(2M + 2),1 (unshown in FIG. 4) | to | 12-(2M + 2),1 and |
| 13-(2M + 2),2 (unshown in FIG. 4) | to | 12-(2M + 2),2; |
| 13-(2M + 3),1 (unshown in FIG. 4) | to | 12-(2M + 3),1, |
| 13-(2M + 3),2 (unshown in FIG. 4) | to | 12-(2M + 3),2, |
| . | | |
| . | | |

| | |
|---|---|
| 13-(3M + 2),1 (unshown in FIG. 4) to | 12-(3M + 2),1, |
| 13-(3M + 2),2 (unshown in FIG. 4) to | 12-(3M + 2),2, |
| 13-(3M + 3),1 (unshown in FIG. 4) to | 12-(3M + 3),1 and |
| 13-(3M + 3),2 (unshown in FIG. 4) to | 12-(3M + 3),2; or |
| 13-(3M + 4),1 (unshown in FIG. 4) to | 12-(3M + 4),1, |
| 13-(3M + 4),2 (unshown in FIG. 4) to | 12-(3M + 4),2, |
| . | . |
| . | . |
| 13-(4M + 3),1 (unshown in FIG. 4) to | 12-(4M + 3),1, |
| 13-(4M + 3),2 (unshown in FIG. 4) to | 12-(4M + 3),2, |
| 13-(4M + 4),1 (unnumbered in FIG. 4) to | 12-(4M + 4),1 and |
| 13-(4M + 4),2 (unnumbered in FIG. 4) to | 12-(4M + 4),2. |

The image sensor of FIG. 4 has in the light receiving area $1a$ a number of electrode sets each respectively consisting of a number of the gate electrodes at each of the CCD registers, that is: M+1 electrode sets consisting of the paired gate electrodes

| | |
|---|---|
| {12-1,1 | and 12-1,2}; |
| {12-2,1 | and 12-2,2 (unnumbered in FIG. 4)}; |
| {12-3,1 | and 12-3,2 (unnumbered in FIG. 4)}; |
| {12-4,1 | and 12-4,2 (unnumbered in FIG. 4)}; |
| {12-5,1 | and 12-5,2 (unnumbered in FIG. 4)}; |
| {12-6,1 | and 12-6,2 (unnumbered in FIG. 4)}; |
| . | . |
| {12-M,1 | and 12-M,2 (unshown in FIG. 4)} and |
| {12-(M + 1),1 | and 12-(M + 1),2 (unshown in FIG. 4)}; |
| {12-(M + 2),1 | and 12-(M + 2),2 (unshown in FIG. 4)}, |
| . | . |
| {12-(2M + 1),1 | and 12-(2M + 1),2 (unshown in FIG. 4)} and |
| {12-(2M + 2),1 | and 12-(2M + 2),2 (unshown in FIG. 4)}; |
| {12-(2M + 3),1 | and 12-(2M + 3),2 (unshown in FIG. 4)}, |
| . | . |
| {12-(3M + 2),1 | and 12-(3M + 2),2 (unshown in FIG. 4)} and |
| {12-(3M + 3),1 | and 12-(3M + 3),2 (unshown in FIG. 4)}; or |
| {12-(3M + 4),1 | and 12-(3M + 4),2 (unshown in FIG. 4)}, |
| . | . |
| {12-(4M + 3),1 | and 12-(4M + 3),2 (unshown in FIG. 4)} and |
| {12-(4M + 4),1 | and 12-(4M + 4),2 (paired in FIG. 4)}. |

Each electrode set may consist of three or more size-reduced gate electrodes sequentially or linearly arranged to permit a precise control in number and shifting of photosensitive locations.

At each of tim CCD registers, the electrode sets are separately arranged in the column direction of the matrix of the CCD registers, and the gate electrodes in each of the electrode sets are separately arranged in a different direction (in a row direction of the matrix or in the horizontal direction in the position of FIG. 4) from the column direction. The direction of separation and/or arrangement of the gate electrodes may preferably be at an inclined or declined angle with respect to the row or column direction to permit an enhanced displacement of a sensitivity barycenter in that direction.

The image sensor of FIG. 4 further has in the light receiving area $1a$ a combination of interconnections among the conductors, that is, interconnections by means of four pairs of interconnection lines:

| | |
|---|---|
| 14-11 interconnecting conductor and every fourth conductors | 13-1,1 13-5,1, 13-9,1, . . . 13-(4M − 3),1 and 13-(4M + 1),1 and |
| 14-12 interconnecting conductor and every fourth conductors | 13-1,2 13-5,2, 13-9,2, . . . 13-(4M − 3),2 and 13-(4M + 1),2; |
| 14-21 interconnecting conductor and every fourth conductors | 13-2,1 13-6,1, 13-10,1, . . . 13-(4M − 2),1 and 13-(4M + 2),1 and |
| 14-22 interconnecting conductor and every fourth conductors | 13-2,2 13-6,2, 13-10,2, . . . 13-(4M − 2),2 and 13-(4M + 2),2; |
| 14-31 interconnecting conductor and every fourth conductors | 13-3,1 13-7,1, 13-11,1, . . . 13-(4M − 1),1 and 13-(4M + 3),1 and |
| 14-32 interconnecting conductor and every fourth conductors | 13-3,2 13-7,2, 13-11,2, . . . 13-(4M − 1),2 and 13-(4M + 3),2; and |
| 14-41 interconnecting conductor and every fourth conductors | 13-4,1 13-8,1, 13-12,1, . . . 13-4M,1 and 13-(4M + 4),1 and |
| 14-42 interconnecting conductor and every fourth conductors | 13-4,2 13-8,2, 13-12,2, . . . 13-4M,2 and 13-(4M + 4),2 | for selectively applying a number of pulse voltages:

| | | |
|---|---|---|
| $\phi 11$ | supplied to interconnection | line 14-11; |
| $\phi 12$ | to | line 14-12; |
| $\phi 21$ | to | line 14-21; |
| $\phi 22$ | to | line 14-22; |
| $\phi 31$ | to | line 14-31; |
| $\phi 32$ | to | line 14-32; |
| $\phi 41$ | to | line 14-41; and |
| $\phi 42$ | to | line 14-42 | different thereamong in phase (as exemplarily shown in FIG. 5) to the gate electrodes in each of the electrode sets.

Accordingly, the electrode sets arranged in the column direction at each of the CCD registers are grouped through the combination of the interconnections among the conductors into four groups of every fourth ones thereof:

{12-1,1, 12-1,2; 12-5,1, 12-5,2; 12-9,1, 12-9,2; . . . 12-(M−6),1, 12-(M−6),2 and 12-(M−2),1, 12-(M−2),2; . . . ;

12-(M+2),1, 12-(M+2),2; . . . ;
12-(2M−5),1, 12-(2M−5),2 and 12-(2M−1),1, 12-(2M−1),2;
12-(2M+3),1, 12-(2M+3),2; . . . ;
12-(3M−4),1, 12-(3M−4),2 and 12−3M,1, 12-3M,2; and
12-(3M+4),1, 12-(3M+4),2; . . . ;
12-(4M−3),1, 12-(4M−3),2 and 12-(4M+1),1, 12-(4M+1),2};

{12-2,1, 12-2,2; 12-6,1, 12-6,2; 12-10,1, 12-10,2; . . . 12-(M−5),1, 12-(M−5),2 and 12-(M−1),1, 12-(M−1),2; . . . ;

12-(M+3),1, 12-(M+3),2; . . . ;
12-(2M−4),1, 12-(2M−4),2 and 12-2M,1, 12-2M,2;
12-(2M+4),1, 12-(2M+4),2; . . . ;
12-(3M−3),1, 12-(3M−3),2 and
12-(3M+1),1, 12-(3M+1),2; and
12-(3M+5),1, 12-(3M+5),2; . . . ;
12-(4M−2),1, 12-(4M−2),2 and 12-(4M+2),1, 12-(4M+2),2};

{12-3,1, 12-3,2; 12-7,1, 12-7,2; 12-11,1, 12-11,2; . . . 12-(M−4),1, 12-(M−4),2 and 12-M,1, 12-M,2; . . . ;

12-(M+4),1, 12-(M+4),2; . . . ;
12-(2M−3),1, 12-(2M−3),2 and 12-(2M+1),1, 12-(2M+1),2;
12-(2M+5),1, 12-(2M+5),2; . . . ;
12-(3M−2),1, 12-(3M−2),2 and
12-(3M+2),1, 12-(3M+2),2; and
12-(3M+6),1, 12-(3M+6),2; . . . ;
12-(4M−1),1, 12-(4M−1),2 and
12-(4M+3),1, 12-(4M+3),2}; and {12-4,1, 12-4,2; 12-8,1, 12-8,2; 12-12,1, 12-12,2; . . . 12-(M−3),1, 12-(M−3),2 and 12-(M+1),1, 12-(M+1),2; . . . ;

12-(M+5),1, 12-(M+5),2; . . . ;
12-(2M−2),1, 12-(2M−2),2 and 12-(2M+2),1, 12-(2M+2),2;
12-(2M+6),1, 12-(2M+6),2; . . . ;
12-(3M−1),1, 12-(3M−1),2 and
12-(3M+3),1, 12-(3M+3),2; and
12-(3M+7),1, 12-(3M+7),2; . . . ;
12-4M,1, 12-4M,2 and 12-(4M+4),1, 12-(4M+4),2} so that each of four pairs of the pulse voltages:
{$\phi$11, $\phi$12};
{$\phi$21, $\phi$22};
{$\phi$31, $\phi$32}; and
{$\phi$41, $\phi$42}
are either selectively supplied (i.e. four voltages different in phase are supplied) to any of the four groups.

The number of the pulse voltages does not exceed the number of the gate electrodes in each of the electrode sets.

Each of the electrode sets in the present embodiment corresponds to each of the conventional gate electrodes, as it is divided to be sequentially arranged in a direction (the horizontal direction in this case) different from the column direction.

Incidentally, according to a species of the present invention, N vertically extending CCD registers may preferably be arranged in the form of a one (row)×N (column) matrix, in which each CCD register has formed thereon (4M+4) (row)×R (column) matrix-addressed gate electrodes (where R is a larger integer than 2).

The present embodiment has, in a panel on a surface portion of the semiconductor substrate made of silicone, the CCD channel 11-1, 11-2 . . . or 11-N as a selectively formed n-type diffusion layer. On the surface of each CCD channel are formed islands each consisting of a polycrystalline silicon film, with an insulating silicon oxide film interposed therebetween. The islands are formed as the electrode sets each consisting of the paired gate electrodes, e.g. 12-1,1 and 12-1,2, and arranged in the column direction.

Incidentally, in the case of a rear incidence type, the conventional example shown in FIG. 1 may have the gate electrodes of the vertical CCD registers in the light receiving area respectively coupled with each other by means of an aluminum wiring layer as a conductor. In the present embodiment also, like wiring layer may be formed in a charge transfer (column) direction and a horizontal (row) direction, for applying the pulse voltages $\phi$11 to $\phi$42.

The N gate electrodes 12-(4n+1),1 (n=0, 1, 2, . . . , M) are linked with each other in the row direction to be applied with the pulse voltage $\phi$11. Similarly, gate electrodes 12-(4n+1),2 are applied with the pulse voltage $\phi$12. Gate electrodes 12-(4n+2),1, 12-(4n+2),2, 12-(4n+3),1, 12-(4n+3),2, 12-(4n+4),1, 12-(4n+4),2 are applied with the pulse voltages $\phi$21, $\phi$22, $\phi$31, $\phi$32, $\phi$41, and $\phi$42, respectively.

Referring now to FIGS. 5 and 6A to 6D, description will be made of a method for driving the image sensor of FIG. 4 in accordance with a preferred embodiment of the present invention.

Figure 5:
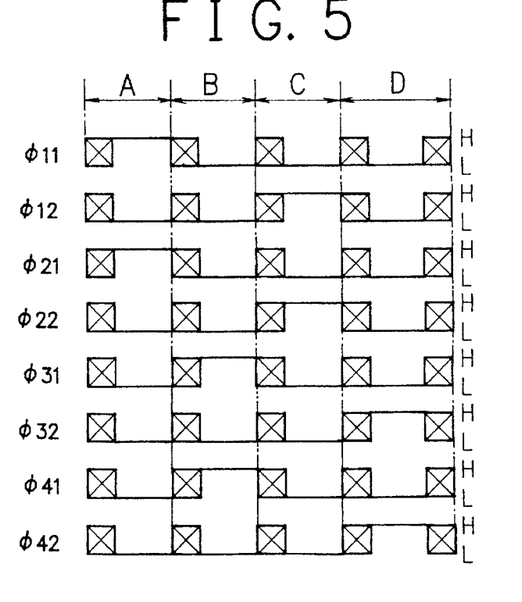
FIG. 5 is a timing chart showing a frame for describing a driving method of the image sensor of FIG. 4 in accordance with a preferred embodiment of another genus of the present invention.

FIG. 5 shows a timing chart of a frame as an operation cycle consisting of four field ranges A to D for driving the image sensor of FIG. 4.

The driving method comprises the steps of applying the pulse voltages $\phi$11 to $\phi$42 with an illustrated combination of different phases in FIG. 5 (in an arbitrary one of the field ranges A to D) to the gate electrodes in each of the electrode sets, and changing the combination of the different phases (in a succesive one of them), thereby controlling the position of a sensitivity barycenter of each of the electrode sets to raise the resolution of the image sensor.

Figure 6A:
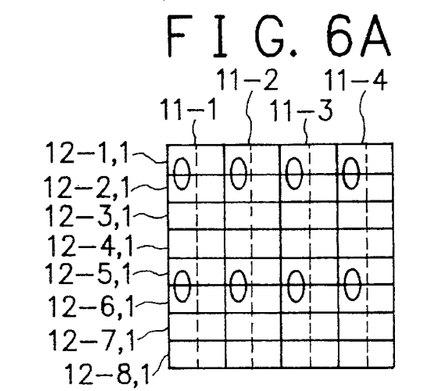
FIGS. 6A to 6D are schematic front views illustrating flexible variations of photo-sensing actions in an essential part of a light receiving area of the image sensor of FIG. 4.
Figure 6B:
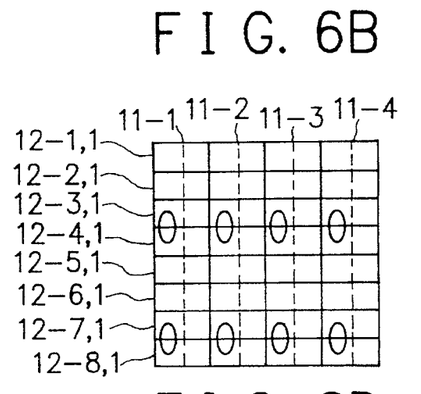
Figure 6C:
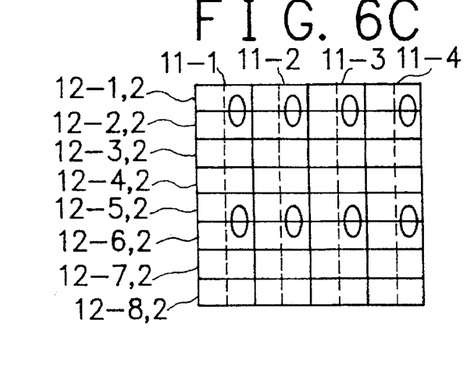
Figure 6D:
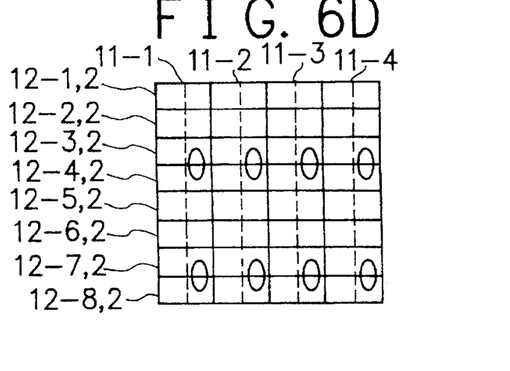

In FIG. 5, a light receiving period is defined as the field range A minus a transfer period designated at X in the frame. In the light receiving period, a voltage "H" is supplied to the gate electrodes 12-(4n+1),1 and 12-(4n+2), 1 on the left side so that photo-sensing develops therebelow. The barycenter of sensitivity resides in the vicinity of each central point between the gate electrodes 12-(4n+1),1 and 12-(4n+2),1. FIG. 6A illustrates the photo-sensing action. In a light receiving period of the field range B, the high voltage "H" is applied to the gate electrodes 12-(4n+3),1 and 12-(4n+4),1, having a photo-sensing developed therebelow. FIG. 6B illustrates locations of sensitivity barycenters in photo-sensing. Similarly, in a light receiving period of the field range C, a photo-sensing develops beneath the gate electrodes 12-(4n+1),2 and 12-(4n+2),2. Barycenters of sensitivity then located are as illustrated in FIG. 6C. In the case of the field range D, associated barycenter locations are illustrated in FIG. 6D. In each transfer period, generated signal charges are transferred from the light receiving area 1a to the memory area 2 to be sent therefrom via the transfer gate 3 to the horizontal CCD register 4 so as to be sequentially outputted therefrom. The output signal is transmitted via the output section 5 of the register 4 to the amplifier 6 so that an amplified signal is delivered from the output terminal 7.

In the transfer periods respectively of the field ranges B and C, the pulse voltages $\phi$12, $\phi$22, $\phi$32, and $\phi$42 are set to "L", whereas for the pulse voltages $\phi$11, $\phi$21, $\phi$31, and $\phi$41 there are utilized transfer clocks respectively having four mutually different phases as shown in FIG. 2. As a result, accumulated charges can be transferred to the memory area 2. This relationship applies to the other transfer periods, also. Namely, in the paired gate electrodes, those to be applied with the voltage "L" during the previous light receiving period are kept at the potential "L" such that the remaining gate electrodes are used to transfer accumulated charges.

In the present embodiment, each frame consists of four fields as described. The present embodiment may however be modified as follows. The gate electrode 12-1,1 on the left side is applied with an H-level voltage H1, and the paired electrode 12-1,2 on the right side is applied with an "H" level H2 lower than H1 so that the barycenter of sensitivity is set to a position shifted from the central point of the gate electrodes toward the gate electrode 12-1,1. Likewise using a frame configured with a combination of several fields each having the right and left gate electrodes applied with mutually different voltages, the spatial resolution may be improved for a certain shooting operation.

Moreover, with voltages to the right and left gate electrodes held constant, the number of fields of each frame may advantageously be decreased to lower the spatial resolution for a desired increase in frame rate.

Further, the timing of transfer clock signals may otherwise be set than for four phases. There may be used one or more phases.

In a concept according to the present invention, in an image sensor having a plurality of photo-sensible vertical CCD registers, each of gate electrodes of the registers are subdivided in a direction different from the signal transfer direction such that independent pulse voltages are applied to the electrodes to control the photo-sensitivity distribution, thereby adapting the resolution and the frame rate to the situation of a image shooting operation. Such flexibility of performance adaptation of image sensor provides an improved usability and an improved production yeild.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An image sensor including a plurality of charge-coupled device ("CCD") registers arranged in the form of a matrix and oriented in a column direction of the matrix, the CCD registers each respectively having a photo-sensitive CCD channel formed therein, the CCD channel having a plurality of gate electrodes disposed thereon, and a plurality of conductors each respectively connected to one of the gate electrodes at each of the CCD registers, said sensor comprising:

a plurality of electrode sets each respectively comprising a plurality of the gate electrodes disposed at each of the CCD registers, the electrode sets being separately arranged in a column direction of the matrix of the CCD registers, the gate electrodes in each of the electrode sets being separately arranged in a different direction from the column direction; and said sensor further comprising a combination of interconnections among the conductors for selectively applying a number of pulse voltages different in phase to the gate electrodes in each of the electrode sets.

2. An image sensor as claimed in claim 1, wherein:

a quantity of pulse voltages different in phase does not exceed a quantity of gate electrodes in each of the electrode sets.

3. An image sensor as claimed in claim 1, wherein the different direction is a row direction of the matrix of the CCD registers.

4. An image sensor including a plurality of charge-coupled device ("CCD") registers arranged in the form of a matrix and oriented in a column direction of the matrix, the CCD registers each respectively having a photo-sensitive CCD channel formed therein, the CCD channel having a plurality of gate electrodes disposed thereon, and a plurality of conductors each respectively connected to one of the gate electrodes at each of the CCD registers, said sensor comprising:

a plurality of electrode sets each respectively comprising a plurality of the gate electrodes disposed at each of the CCD registers, the electrode sets being separately arranged in a column direction of the matrix of the CCD registers, the gate electrodes in each of the electrode sets being separately arranged in a different direction from the column direction; and said sensor further comprising a combination of interconnections among the conductors for selectively applying a number of pulse voltages different in phase to the gate electrodes in each of the electrode sets, wherein the electrode sets arranged in the column direction at each of the CCD registers are grouped through the combination of the interconnections among the conductors into four groups of every fourth row in said different direction so that four of the pulse voltages are selectively supplied to the four groups.

5. A method for driving an image sensor including a plurality of charge-coupled device ("CCD") registers arranged in the form of a matrix and oriented in a column direction of the matrix, the CCD registers each respectively having a photo-sensitive CCD channel formed therein, the CCD channel having a plurality of gate electrodes disposed thereon, a plurality of conductors each respectively connected to an arbitrary one of the gate electrodes at each of the CCD registers, a plurality of electrode sets each respectively comprising a plurality of the gate electrodes disposed at each of the CCD registers, the electrode sets being separately arranged in a column direction of the matrix of the CCD registers, the gate electrodes in each of the electrode sets being separately arranged in a different direction from the column direction, and a combination of interconnections among the conductors for selectively applying a plurality of pulse voltages in different phases to the gate electrodes in each of the electrode sets, comprising the steps of:

applying the pulse voltages with a combination of said different phases to the gate electrodes in each of the electrode sets; and changing the combination of the different phases, thereby controlling a position of a sensitivity barycenter of each of the electrode sets for raising the resolution of the image sensor.

6. An image sensor comprising:

a plurality of first charge-coupled device ("CCD") registers arrayed in a form of a first matrix, said first CCD registers each respectively comprising:

a CCD channel sensitive to a distribution of incident light for converting said incident light into quantities of charges and, depending on a potential distribution, said CCD channel being for holding signal charges corresponding to said quantities of charges and, depending on a variation of said potential distribution, said CCD channel being for transferring said signal charges in a principal charge transfer direction corresponding to a column direction of said first matrix, and a plurality of electrode groups within said CCD channel arranged substantially in said column direction, said electrode groups each respectively comprising a plurality of electrode sets, said electrode sets each respectively comprising a plurality of gate electrodes arranged in a second direction substantially perpendicular to said column direction; and a plurality of conductor groups each respectively comprising a plurality of conductor combinations, each conductor combination respectively comprising a plurality of conductors each conductor supplying a corresponding one of a plurality of control signals in a corresponding one of a plurality of signal combinations to a corresponding one of said gate electrodes in a corresponding one of said electrode sets in a corresponding one of said electrode groups in a corresponding one of said first CCD registers such that said CCD channel in a respective one of said first CCD registers develops said potential distribution and said variation.

7. An image sensor according to claim 6, further comprising:

a plurality of second CCD registers arranged in parallel for receiving and storing said signal charges, as they are transferred from corresponding ones of said first CCD registers along said principal charge transfer direction, for outputting cumulated signal charges; and a third CCD register for receiving said cumulated signal charges from said plurality of second CCD registers for outputting a sequence of image signals.

8. An image sensor comprising:

receiving means for receiving light and converting said light into a signal; and transferring means, connected to said receiving means, for transferring and outputting said signal, said receiving means comprising a plurality of parallel charge-coupled device ("CCD") registers positioned in a first direction, each of said CCD registers including a plurality of grouped electrodes, wherein electrodes in each of said grouped electrodes being separately arranged in a second direction different from said first direction, said receiving means further comprising a plurality of conductors connected to electrodes of said grouped electrodes, wherein each electrode within a respective one of said grouped electrodes is connected to a different conductor of said conductors, said conductors connecting said electrodes in said second direction such that each of said conductors connect a same respective electrode within each of said grouped electrodes and said conductors supplying pulsed voltage to said electrodes in said second direction.

9. An image sensor as in claim 8, wherein said CCD registers comprise a matrix.

10. An image sensor as in claim 8, wherein said grouped electrodes each include two electrodes.

11. An image sensor as in claim 8, wherein said grouped electrodes each include more than two electrodes.

12. An image sensor as in claim 8, wherein said first direction is perpendicular to said second direction.

13. An image sensor as in claim 8, wherein said first direction is a principal charge transfer direction of said signal.

14. An image sensor as in claim 8, wherein said conductors supply said pulsed voltages in different phases to respective ones of said electrodes within said grouped electrodes.

15. An image sensor as in claim 14, wherein a number of said phases is no greater that a number of said electrodes within each of said grouped electrodes.

16. An image sensor as in claim 14, wherein said conductors are grouped into a plurality of conductor sets, such that each conductor set supplies a pulsed voltage having a same phase.

17. An image sensor as in claim 16, wherein said plurality of conductor sets comprises four conductor sets.

18. An image sensor as in claim 8, wherein each of said grouped electrodes include a same number of said electrodes.

19. An image sensor as in claim 8, wherein said CCD registers further comprise a CCD channel positioned in said first direction for holding said signals.

20. An image sensor as in claim 8, wherein said pulsed voltage creates varying voltages among said electrodes for varying a characteristic of different regions of said image sensor.

* * * * *